United States Patent
Kushihara et al.

(10) Patent No.: US 9,972,507 B2
(45) Date of Patent: May 15, 2018

(54) METHOD FOR ENCAPSULATING LARGE-AREA SEMICONDUCTOR ELEMENT-MOUNTED BASE MATERIAL

(71) Applicant: SHIN-ETSU CHEMICAL CO., LTD., Tokyo (JP)

(72) Inventors: Naoyuki Kushihara, Annaka (JP); Kazuaki Sumita, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days. days.

(21) Appl. No.: 15/483,262

(22) Filed: Apr. 10, 2017

(65) Prior Publication Data

US 2017/0316956 A1  Nov. 2, 2017

(30) Foreign Application Priority Data

May 2, 2016 (JP) ................. 2016-092558

(51) Int. Cl.
| | |
|---|---|
| H01L 21/00 | (2006.01) |
| H01L 21/56 | (2006.01) |
| B29C 70/72 | (2006.01) |
| B29C 70/88 | (2006.01) |
| C08G 59/42 | (2006.01) |
| C08G 59/62 | (2006.01) |
| C08L 63/00 | (2006.01) |
| H01L 23/29 | (2006.01) |
| B29K 63/00 | (2006.01) |
| B29K 105/20 | (2006.01) |
| B29L 9/00 | (2006.01) |
| B29L 31/34 | (2006.01) |

(52) U.S. Cl.
CPC ............ H01L 21/56 (2013.01); B29C 70/72 (2013.01); B29C 70/882 (2013.01); C08G 59/4238 (2013.01); C08G 59/621 (2013.01); C08L 63/00 (2013.01); H01L 23/29 (2013.01); B29K 2063/00 (2013.01); B29K 2105/20 (2013.01); B29K 2995/0005 (2013.01); B29L 2009/00 (2013.01); B29L 2031/3481 (2013.01); C08L 2203/206 (2013.01); H01L 2924/186 (2013.01)

(58) Field of Classification Search
CPC ....... H01L 21/56; H01L 23/29; H01L 23/293; B29C 70/72; B29C 70/882; C08G 73/1039; C08G 73/1046; C08G 59/4042; C08G 59/4238; C08G 59/621; C08G 59/688; C08G 73/1064; C08L 63/00; C08L 79/08
USPC .......................................... 438/127
See application file for complete search history.

(56) References Cited

U.S. PATENT DOCUMENTS

| | | | |
|---|---|---|---|
| 2005/0037543 A1 | 2/2005 | Tsumura et al. | |
| 2009/0062430 A1* | 3/2009 | Ikezawa | C08G 59/621 523/400 |
| 2009/0286087 A1* | 11/2009 | Tanaka | C08G 59/4042 428/418 |
| 2011/0105646 A1 | 5/2011 | Kan et al. | |
| 2012/0139131 A1 | 6/2012 | Sugo et al. | |
| 2014/0296437 A1 | 10/2014 | Hatae et al. | |

FOREIGN PATENT DOCUMENTS

| | | |
|---|---|---|
| JP | 2011-116843 A | 6/2011 |
| JP | 2012-209453 A | 10/2012 |
| JP | 2014-229771 A | 12/2014 |

OTHER PUBLICATIONS

Extended European Search Report dated Sep. 29, 2017, in European Patent Application No. 17166464.2.

* cited by examiner

*Primary Examiner* — Brook Kebede
(74) *Attorney, Agent, or Firm* — Birch, Stewart, Kolasch & Birch, LLP

(57) ABSTRACT

Provided is an encapsulation method not causing molding failures such as filling failures and flow marks when collectively encapsulating a large-area silicon wafer or substrate with a resin composition. Specifically, provided is a method for encapsulating a semiconductor element-mounted base material, using a curable epoxy resin composition containing: an epoxy resin (A), a curing agent (B), a pre-gelatinizing agent (C) and a filler (D). The semiconductor element-mounted base material is collectively encapsulated under conditions of (a) molding method: compression molding, (b) molding temperature: 100 to 175° C., (c) molding period: 2 to 20 min and (d) molding pressure: 50 to 350 kN.

12 Claims, No Drawings

METHOD FOR ENCAPSULATING LARGE-AREA SEMICONDUCTOR ELEMENT-MOUNTED BASE MATERIAL

BACKGROUND OF THE INVENTION

Field of the Invention

The present invention relates to a method for encapsulating a semiconductor element-mounted base material. Especially, the invention relates to a method for collectively encapsulating a large-area silicon wafer or substrate by performing compression molding under a given set of conditions, using a particular resin composition for semiconductor element encapsulation.

Background Art

In recent years, semiconductor devices have been subjected to a tremendous level of technological innovation. For example, the technology of TSV (through silicon via) has been utilized to connect semiconductor elements stacked in layers in a way such that portable information communication terminals such as smartphones and tablets are allowed to process large volumes of information at high speed. The semiconductor elements that are connected together in the multilayered manner are to be bonded to a silicon interposer of a size of 8 inch (about 20 cm) to 12 inch (30 cm) through flip chip bonding, followed by using a heat-curable resin to encapsulate the semiconductor elements per each interposer. Later, an unwanted portion of a cured resin formed on the semiconductor elements is abraded off, followed by dividing the encapsulated product into individual pieces, thereby obtaining a small and thin multifunctional semiconductor device(s) capable of performing high-speed processing. Moreover, in recent years, encapsulation layers are becoming thicker as the result of stacking semiconductor elements. For this reason, the mainstream semiconductor device has been a thinned semiconductor device obtained by abrading a resin layer of the encapsulation layer (e.g. JP-A-2014-229771).

If using a substrate such as a small-diameter wafer, semiconductor elements can be encapsulated and molded without any significant problem even under the current situation. However, when it comes to the molding of a wafer of a size of 8 inch or larger or, in recent years, a size of 20 inch; and the molding of a panel of a size of greater than 20 inch, an epoxy resin or the like tends to exhibit a significant contraction stress after encapsulation. Due to such reason, there has been a problem that semiconductor elements will be peeled off from a substrate such as a metal substrate under this circumstance, and it has thus been difficult to pursue mass production. Further, in order to solve the aforementioned problem associated with large-diameter wafers, glass substrates and metal substrates, it has been required that a resin be filled with a filler by an amount of not smaller than 90% by mass, or that the contraction stress occurring at the time of curing be reduced by lowering the elasticity of the resin (e.g. JP-A-2012-209453).

Further, as a result of wholly encapsulating a silicon interposer with a heat-curable resin, a significant warpage will occur due to a difference in thermal expansion coefficient between silicon and the heat-curable resin. Since such significant warpage leads to problems in an abrasion step and a dicing step, and warpage prevention has thus become a critical technical issue.

A conventional method for preventing warpage is to fill a composition comprised of an epoxy resin and a curing agent such as an acid anhydride or a phenolic resin with a filler by an amount of not smaller than 85% by mass, and then use an encapsulation material containing a rubber or a thermoplastic resin for the purpose of alleviating stress (e.g. JP-A-2011-116843). However, the problems with such composition are that it is inferior in flowability due to the large amount of filler contained therein; and that not only filling failures may occur, but flow marks may also occur on the outer circumferential portion of a wafer, when performing encapsulation and molding of a thin-film element.

Here, a filling failure refers to resin chipping occurring on the outer circumferential portion of a wafer. In short, a consequence of the occurrence of such filling failure is that a sensor may erroneously recognize an unfilled portion as a notch when the wafer is being transported in a later step, which leads to a concern that a positioning property may be impaired. In addition, a flow mark refers to a white flow mark left in a radial fashion from the center of a molded product toward the outside. The occurrence of such flow marks may lead to a poor appearance and inconsistent properties of a cured product, which may, for example, lead to a degraded reliability.

SUMMARY OF THE INVENTION

Therefore, it is an object of the invention to provide an encapsulation method not causing molding failures such as filling failures and flow marks when collectively encapsulating a large-area silicon wafer or substrate with a resin composition.

In view of the abovementioned actual circumstances, the inventors of the invention conducted a series of studies and completed the invention as follows. That is, the inventors found that a large-area wafer or a large-size substrate could be collectively encapsulated by performing compression molding under a given set of conditions, using a particular resin composition for semiconductor element encapsulation. In such case, the "large-area wafer" refers to a wafer having a diameter of not smaller than 8 inch (20 cm), and the "large-size substrate" refers to a substrate of a size of not smaller than 200 mm vertical×200 mm horizontal.

That is, the present invention is as follows.

[1]

A method for encapsulating a semiconductor element-mounted base material, comprising an encapsulation step of collectively encapsulating a semiconductor element-mounted surface of a semiconductor element-mounted substrate of a size of not smaller than 200 mm square; or a semiconductor element-formed surface of a semiconductor element-formed wafer having a diameter of not smaller than 200 mm $\phi$, using a curable epoxy resin composition comprising (A) an epoxy resin;

(B) a curing agent;

(C) a pre-gelatinizing agent in an amount of 5 to 30 parts by mass per a total of 100 parts by mass of said epoxy resin (A) and said curing agent (B); and (D) a filler in an amount of 100 to 2,500 parts by mass per a total of 100 parts by mass of said epoxy resin (A), said curing agent (B) and said pre-gelatinizing agent (C), wherein said encapsulation step is performed under the following conditions:

(a) molding method: compression molding;

(b) molding temperature: 100 to 175° C.;

(c) molding period: 2 to 20 min; and (d) molding pressure: 50 to 350 kN.

[2]

The method for encapsulating the semiconductor element-mounted base material according to [1], wherein post curing is further performed in said encapsulation step under the following conditions:

(e) curing temperature: 100 to 250° C.; and (f) curing period: 0.5 to 10 hours.

[3]

The method for encapsulating the semiconductor element-mounted base material according to [1] or [2], wherein said curing agent (B) is an acid anhydride-based curing agent, and is used in an amount at which a molar ratio of acid anhydride groups in said acid anhydride-based curing agent to 1 mol of epoxy groups in said epoxy resin (A) becomes 0.5 to 1.5.

[4]

The method for encapsulating the semiconductor element-mounted base material according to [1] or [2], wherein said curing agent (B) is an phenol-based curing agent, and is used in an amount at which a molar ratio of phenolic hydroxyl groups in said phenol-based curing agent to 1 mol of epoxy groups in said epoxy resin (A) becomes 0.5 to 2.0.

[5]

The method for encapsulating the semiconductor element-mounted base material according to any one of [1] to [4], wherein said pre-gelatinizing agent (C) is a thermoplastic resin.

According to the wafer or substrate encapsulation method of the invention, a semiconductor element-mounted base material having a large area can be collectively encapsulated, and the occurrences of filling failures and flow marks can be controlled. Further, a wafer or substrate encapsulated by the encapsulation method of the invention exhibits a low level of warpage and is superior in heat resistance.

DETAILED DESCRIPTION OF THE INVENTION

The present invention is described in detail hereunder. However, the invention is not limited to the following examples.

Resin Composition for Semiconductor Element Encapsulation

A resin composition of the invention for semiconductor element encapsulation is a curable epoxy resin composition containing: (A) an epoxy resin; (B) a curing agent; (C) a pre-gelatinizing agent; and (D) a filler. These components are described below in detail.

(A) Epoxy Resin

The epoxy resin as the component (A) of the invention is a main component of the resin composition for semiconductor element encapsulation, and a known epoxy resin may be sued as the component (A). Examples of the epoxy resin as the component (A) include a bisphenol A-type epoxy resin; a bisphenol F-type epoxy resin; a bisphenol S-type epoxy resin; a phenol novolac-type epoxy resin; a cresol novolac-type epoxy resin; a bisphenol A novolac-type epoxy resin; a bisphenol F novolac-type epoxy resin; a stilbene-type epoxy resin; a triazine skeleton-containing epoxy resin; a fluorene skeleton-containing epoxy resin; a triphenol alkane-type epoxy resin; a biphenyl-type epoxy resin; a xylylene-type epoxy resin; a biphenyl aralkyl-type epoxy resin; a naphthalene-type epoxy resin; a dicyclopentadiene-type epoxy resin; an alicyclic epoxy resin; polycyclic aromatic diglycidyl ether compounds such as multifunctional phenols and anthracene; and phosphorus-containing epoxy resins obtained by introducing phosphorus compounds into the abovementioned epoxy resins or compounds. Among these examples, preferred are a bisphenol A-type epoxy resin, a bisphenol F-type epoxy resin, an alicyclic epoxy resin and a multifunctional phenolic diglycidyl ether compound. Any one of the above examples as the component (A) may be used singularly, or two or more of them may be used in combination.

It is preferred that the epoxy resin (A) be contained in the resin composition for semiconductor element encapsulation, by an amount of 3 to 30% by mass, more preferably 4 to 15% by mass, or even more preferably 5 to 10% by mass. When the epoxy resin (A) is contained by an amount of smaller than 3% by mass, it may be difficult to mold the resin composition for semiconductor element encapsulation. When the epoxy resin (A) is contained by an amount of larger than 30% by mass, a significant degree of warpage of a molded product may be exhibited after encapsulation.

(B) Curing Agent

There are no particular restrictions on the curing agent as the component (B) used in the resin composition of the invention for semiconductor element encapsulation, as long as the curing agent is reactive with the epoxy resin as the component (A). This curing agent is added to obtain a cured product with a three-dimensional cross-linked structure, by allowing the reactive functional groups (e.g. amino group, phenolic hydroxyl group and acid anhydride group) in the molecules of such curing agent to react with the epoxy groups in the epoxy resin as the component (A).

Examples of such curing agent as the component (B) include an amine-based curing agent, a phenol-based curing agent and an acid anhydride-based curing agent, among which an acid anhydride-based curing agent is preferred.

Examples of the abovementioned amine-based curing agent include aromatic diaminodiphenylmethane compounds such as 3,3'-diethyl-4,4'-diaminophenylmethane, 3,3',5,5'-tetramethyl-4,4'-diaminophenylmethane and 3,3',5,5'-tetraethyl-4,4'-diaminophenylmethane; 2,4-diaminotoluene; 1,4-diaminobenzene; and 1,3-diaminobenzene. Any one of these amine-based curing agents may be used singularly, or two or more of them may be used in combination. Here, preferred are 3,3'-diethyl-4,4'-diaminophenylmethane and 2,4-diaminotoluene.

It is preferred that a molar ratio of the amino groups in the amine-based curing agent to 1 mol of the epoxy groups in the component (A) be 0.7 to 1.2, more preferably 0.7 to 1.1, or even more preferably 0.85 to 1.05. When this molar ratio is lower than 0.7, unreacted epoxy groups may remain in a way such that a glass-transition temperature may decrease, or that an adhesion may be impaired. Further, when such molar ratio is higher than 1.2, the cured product may become hard and brittle in a way such that cracks may occur at the time of performing reflow or a temperature cycle test.

Examples of the abovementioned phenol-based curing agent include a phenol novolac resin, a naphthalene ring-containing phenolic resin, an aralkyl-type phenolic resin, a triphenolalkane-type phenolic resin, a biphenyl skeleton-containing aralkyl-type phenolic resin, a biphenyl-type phenolic resin, an alicyclic phenolic resin, a heterocyclic phenolic resin, a naphthalene ring-containing phenolic resin, a resorcinol-type phenolic resin, an allyl group-containing phenolic resin, a bisphenol A-type resin, a bisphenol F-type resin and a bisphenol S-type phenolic resin. Here, any one of these phenol-based curing agents may be used singularly, or two or more of them may be used in combination.

Particularly, preferred are an allyl group-containing phenolic resin and a phenol novolac resin.

When the phenolic resin(s) are used as the curing agent, it is preferred that a molar ratio of the phenolic hydroxyl groups in the curing agent to 1 mol of the epoxy groups in the epoxy resin be 0.5 to 2.0, more preferably 0.8 to 1.5.

Examples of the abovementioned acid anhydride-based curing agent include 3,4-dimethyl-6-(2-methyl-1-propenyl)-1,2,3,6-tetrahydrophthalic anhydride; 1-isopropyl-4-methyl-bicyclo [2.2.2] oct-5-ene-2; 3-dicarboxylic anhydride; methyltetrahydrophthalic anhydride; methylhexahydrophthalic anhydride; hexahydrophthalic anhydride; methylhimic anhydride; pyromellitic dianhydride; allo-ocimene-maleic anhydride adduct; benzophenonetetracarboxylic dianhydride; 3,3',4,4'-biphenyltetrabisbenzophenone tetracarboxylic dianhydride; (3,4-dicarboxyphenyl) ether dianhydride; bis (3,4-dicarboxyphenyl) methane dianhydride; and 2,2-bis (3,4-dicarboxyphenyl) propane dianhydride. Any one of these acid anhydride-based curing agents may be used singularly, or two or more of them may be used in combination. Among these acid anhydride-based curing agents, preferred are 3,4-dimethyl-6-(2-methyl-1-propenyl)-1,2,3,6-tetrahydrophthalic anhydride; 1-isopropyl-4-methyl-bicyclo [2.2.2] oct-5-ene-2; 3-dicarboxylic anhydride; methyltetrahydrophthalic anhydride; methylhexahydrophthalic anhydride; and hexahydrophthalic anhydride.

When the acid anhydride-based curing agent(s) are used, it is preferred that a molar ratio of the acid anhydride groups (—CO—O—CO—) in the curing agent to 1 mol of the epoxy groups in the epoxy resin (A) be 0.5 to 1.5, more preferably 0.7 to 1.3, or even more preferably 0.9 to 1.1. When this molar ratio is lower than 0.5, unreacted epoxy groups may remain in a way such that the glass-transition temperature may decrease, and even the adhesion may be impaired. Further, when such molar ratio is higher than 1.5, the cured product may become hard and brittle in a way such that cracks may occur at the time of performing reflow or a temperature cycle test.

(C) Pre-Gelatinizing Agent

The pre-gelatinizing agent as the component (C) of the invention is to restrict the occurrence of flow marks and cure shrinkage-induced warpage of a molded product, such flow marks and warpage being attributed to a decreased viscosity of a heated epoxy resin. It is preferred that such pre-gelatinizing agent be a powder capable of being easily dispersed at the time of preparing the composition. Moreover, it is preferred that the pre-gelatinizing agent be able to be easily melted in a low-temperature range, and exhibit favorable compatibilities with epoxy resins as well as with a curing agent, a filler and other additives that are used as necessary.

It is preferred that the aforementioned powder have an average particle diameter of 0.2 to 50 μm, more preferably 0.5 to 50 μm, particularly preferably about 1 to 10 μm. The pre-gelatinizing agent can be easily dispersed in the epoxy resin when the average particle diameter is within these ranges. Specifically, the average particle diameter is a cumulative mass average value $D_{50}$ (or median diameter) obtained through particle size distribution measurement using a laser diffraction method. Further, it is preferred that the pre-gelatinizing agent be a thermoplastic resin capable of being easily melted in, for example, an epoxy resin in a low-temperature range, and thus exhibiting a favorable compatibility. Examples of such thermoplastic resin include an acrylic resin, a vinyl chloride resin, and a polyamide resin, among which an acrylic resin is preferred in terms of heat resistance. Further, the pre-gelatinizing agent may also be a partially cross-linked product, or more preferably a non-cross-linked product.

In addition, from the perspective of achieving a high gelation effect, it is preferred that the number average molecular weight of the pre-gelatinizing agent be 10,000 to 10,000,000, more preferably 100,000 to 5,000,000. Here, the number average molecular weight refers to a value measured by gel permeation chromatography (GPC) using polystyrene as a standard substance.

Specific examples of the pre-gelatinizing agent include acrylic resins such as product names ZEFIAC F-301, F-303, F-320, F-325, F-340M and F-351 by Aica Kogyo Co., Ltd. Any one of these agents may be used singularly, or two or more of them may be used in combination. The pre-gelatinizing agent is substantially in the form of a solid at about 25 to 80° C., and will soften or even melt at about 80 to 120° C. After the pre-gelatinizing agent has softened or melted, it will become compatible with other components so as to make it difficult for the viscosity of the epoxy resin composition to reach a low level. There, coupled with the fact that the epoxy resin will be gelatinized by reaction with the curing agent, the composition is allowed to reach a gel state in a short period of time.

It is preferred that the pre-gelatinizing agent be used in an amount of 5 to 30 parts by mass, particularly preferably 10 to 20 parts by mass, per 100 parts by mass of the epoxy resin (A) and the curing agent (B). When the pre-gelatinizing agent is used in an amount of smaller than 5 parts by mass, there may not be sufficiently achieved the gelation effect before the epoxy resin is gelatinized by the abovementioned reaction. Further, when the pre-gelatinizing agent is used in an amount of larger than 30 parts by mass, heat resistance may be impaired.

(D) Filler

The filler as the component (D) of the invention is added to reduce the thermal expansion rate of the resin composition for semiconductor element encapsulation, and improve the moisture resistance reliability thereof. Examples of such filler include: silicas such as a molten silica, a crystalline silica and cristobalite; alumina; silicon nitride; aluminum nitride; boron nitride; titanium oxide; glass fibers; and magnesium oxide. The average particle diameters and shapes of these fillers may be selected based on the intended use. Particularly, spherical alumina, spherical molten silica, glass fibers and the like are preferred.

It is preferred that the filler be added in an amount of 100 to 2,500 parts by mass, particularly preferably 200 to 1,900 parts by mass, per a total of 100 parts by mass of the components (A) to (C).

(E) Other Additive

The resin composition of the invention for semiconductor element encapsulation can be obtained by combining the given amounts of the components (A), (B), (C) and (D). However, an other additive(s) as a component (E) may be added if necessary, without impairing the objectives and effects of the invention. Examples of such additive(s) include a curing accelerator, a polymerization initiator, a mold release agent, a flame retardant, an ion trapping agent, an antioxidant, an adhesion imparting agent, a low stress agent, a coloring agent and a coupling agent.

There are no particular restrictions on the curing accelerator, as long as it is capable of promoting the curing reaction of the epoxy resin as the component (A). Examples of such curing accelerator include phosphorus compounds such as triphenylphosphine, tributylphosphine, tri (p-methylphenyl) phosphine, tri (nonylphenyl) phosphine, triphenylphosphine-triphenylborane and tetraphenylphosphine-tetraphenylborate; tertiary amine compounds such as triethylamine, benzyldimethylamine, α-methylbenzyldimethylamine and 1,8-diazabicyclo [5.4.0] undecene-7; and imidazole compounds such as 2-methylimidazole, 2-phenylimidazole and 2-phenyl-4-methylimidazole. Among these examples, triphenylphosphine and triphenylphosphine-triphenylborane are preferred. It is preferred that the curing accelerator be added in an amount of 0.1 to 10 parts by mass, particularly preferably 0.5 to 5 parts by mass, per a total of 100 parts by mass of the components (A) and (B).

The mold release agent is added to improve a mold releasability of the cured product from a mold, and any known mold release agent can be used. Examples of such mold release agent include a carnauba wax; a rice wax; a candelilla wax; polyethylene; a polyethylene oxide; polypropylene; a montanic acid; a montan wax as an ester compound of a montanic acid and an alcohol such as a saturated alcohol, 2-(2-hydroxyethylamino) ethanol, ethylene glycol or glycerin; a stearic acid; a stearic acid ester; and a stearic acid amide.

The flame retardant is added to impart a flame retardance. There are no particular restrictions on such flame retardant, and any known flame retardant may be used. Examples of such flame retardant include a phosphazene compound, a silicone compound, a zinc molybdate-supported talc, a zinc molybdate-supported zinc oxide, an aluminum hydroxide, a magnesium hydroxide and a molybdenum oxide.

The ion trapping agent is added to trap the ion impurities contained in the resin composition, and avoid a thermal degradation and a moisture absorption degradation. There are no particular restrictions on such ion trapping agent, and any known ion trapping agent may be used. Examples of such ion trapping agent include hydrotalcites, a bismuth hydroxide compound and rare-earth oxides.

The amount of the component (E) added varies depending on the intended use of the resin composition for semiconductor element encapsulation. However, it is preferred that each additive be added in an amount of not larger than 10% by mass of the whole resin composition for semiconductor element encapsulation.

The viscosity of the resin composition of the invention for semiconductor element encapsulation is a value measured two minutes after positioning a specimen thereof, using an E-type viscometer at 25° C. and in accordance with JIS Z8803:2011. It is preferred that the viscosity of the resin composition for semiconductor element encapsulation be 10 to 1,000 Pa·s, more preferably 50 to 700 Pa·s. The amount of an inorganic filler used may be appropriately changed to adjust the viscosity of the resin composition of the invention.

Production of resin composition for semiconductor element encapsulation

The resin composition of the invention for semiconductor element encapsulation can be produced by, for example, the following method.

A mixture of the components (A), (B), (C) and (D) is obtained by simultaneously or separately mixing, stirring, melting and/or dispersing the epoxy resin (A), the curing agent (B), the pre-gelatinizing agent (C) and the filler (D) while performing a heating treatment if necessary. At that time, the other additive(s) as the component (E), such as the curing accelerator, the mold release agent, the flame retardant and the ion trapping agent, may be added to the mixture of the components (A), (B), (C) and (D). Each of the components (A) to (E) may include only one kind of them, or two or more kinds of them.

There are no particular restrictions on a device(s) for performing mixing, stirring, dispersion or the like. However, examples of such device(s) include a kneader equipped with a stirring and heating devices, a triple-roll mill, a ball mill, a planetary mixer and a bead mill. These devices can also be appropriately used in combination.

Semiconductor Element-Mounted Base Material Encapsulation Step

This step is to collectively encapsulate a large-area semiconductor element-mounted base material with the aforementioned resin composition for semiconductor element encapsulation.

That is, the resin composition for semiconductor element encapsulation is at first taken by an amount which will allow the resin composition to reach a given thickness in due course. A laminated semiconductor element mounted on a large-area wafer or organic substrate is then filled with the resin composition of such amount applied to the element. Next, a molding device capable of performing compression molding on such base material is, for example, used to perform encapsulation under the following molding conditions (i.e. molding temperature, molding period and molding pressure). In order to further cure the resin composition for semiconductor element encapsulation after completing encapsulation, post curing may be performed if necessary at a given curing temperature and for a given curing period.

(1) Resin thickness

Although the thickness of the encapsulation resin may be appropriately determined based on the semiconductor element, it is preferred that this thickness be 50 to 3,000 μm, particularly preferably 100 to 2,000 μm. Further, when a silicon wafer is used as the base material, the thickness of the encapsulation resin may be that not causing cracks, chipping or the like at the time of molding. Particularly, it is preferred that such thickness of the silicon wafer be 10 to 1,000 μm, more preferably 20 to 775 μm.

(2) Size of Base Material

A large-area silicon wafer in the present invention refers to a wafer having a diameter of not smaller than 200 mm. In fact, such large-area silicon wafer targets at those having a diameter of 200 to 450 mm. Further, when using a substrate as the base material, the substrate may simply be thick enough to exhibit a supporting function at the time of performing compression molding. It is preferred that such substrate have a thickness of 30 to 5,000 μm, more preferably 50 to 3,000 μm. In addition, with regard to the size of the substrate, a substrate will be regarded as a "large-area substrate" in the present invention if it is a quadrangle having a length of 200 mm or longer and a width of 200 mm or wider. In fact, the large-area substrates targeted by the present invention are those having a length of 200 to 650 mm and a width of 200 to 650 mm.

(3) Type of Base Material

Examples of the base material include a ceramic substrate; a copper or aluminum substrate with an insulated surface; a BT (bismaleimide triazine) resin substrate; and a FRP (fiber reinforced plastics) substrate, among which a BT resin substrate and a ceramic substrate are preferred.

(4) Molding Condition

Conditions for performing compression molding are: molding temperature 100 to 175° C., preferably 120 to 175° C.; molding period 2 to 20 min, preferably 3 to 10 min; molding pressure 50 to 350 kN, preferably 150 to 350 kN.

(5) Complete Curing Condition (Post Curing)

As for the base material that has been encapsulated under the aforementioned conditions, the resin composition for semiconductor element encapsulation is further cured at a temperature of 100 to 250° C., preferably 150 to 250° C., for a period of 0.5 to 10 hours, preferably 1 to 5 hours.

WORKING EXAMPLE

The present invention is described in greater detail hereunder with reference to working and comparative examples. However, the invention is not limited to the following examples.

PREPARATION EXAMPLE

In preparation examples 1 to 12 and comparative preparation examples 1 to 4, the resin compositions for semiconductor element encapsulation were prepared by combining the following components at the composition ratios shown in Table 1. Here, in Table 1, the amounts of the components (A) to (E) are expressed as parts by mass.
(A) Epoxy Resin
  (A1) Bisphenol F-type epoxy resin (YDF-8170 by Mitsubishi Chemical Corporation)
  (A2) Trifunctional epoxy resin (EP630 by Mitsubishi Chemical Corporation)
  (A3) Alicyclic epoxy resin (CEL2021P by Daicel Corporation)
(B) Curing Agent
  (B1) Allylphenol-type phenolic resin (MEH-8000H by MEIWA PLASTIC INDUSTRIES, LTD.)
  (B2) Acid anhydride curing agent (RIKACID MH by New Japan Chemical Co., Ltd.)
(C) Pre-Gelatinizing Agent
  (C1) Epoxy goup-modified acrylic resin having an average particle diameter of 2.0 µm (F-301 by AICA Kogyo Co., Ltd.)
  (C2) Acrylic resin having an average particle diameter of 2.0 µm (F-320 by AICA Kogyo Co., Ltd.)
(D) Filler
  (D1) Spherical silica having an average particle diameter of 8 µm (by Tatsumori Ltd.)
  (D2) Spherical silica having an average particle diameter of 13 µm (CS-6103 53C by Tatsumori Ltd.)
(E) Other Components
  (E1) Microcapsule-type latent curing accelerator (Novacure HX3088 by ASAHI KASEI E-materials Corp.)
  (E2) Pigment (Mitsubishi carbon black 3230MJ by Mitsubishi Chemical Corporation)

WORKING EXAMPLES 1 TO 12

In working examples 1 to 10, there was used an wafer having a diameter of 8-inch and a thickness of 725 µm; in working examples 11 and 12, there was used a 290 mm×290 mm BT (bismaleimide triazine) resin-made organic substrate having a thickness of 700 µm. In working examples 1 to 12, the compositions that had been prepared in the preparation examples 1 to 12 were individually used as the resin compositions for semiconductor element encapsulation. Specifically, in working examples 1 to 12, a wafer molding device (MZ824-1 by APIC YAMADA CORPORATION) was used to perform compression molding under a molding pressure of 350 kN and a molding temperature of 120° C. for a molding period of 600 sec, where the resin thickness was set to 100 µm. Each resin composition for semiconductor element encapsulation was then completely cured (post-cured) at a curing temperature of 150° C. for a curing period of four hours.

COMPARATIVE EXAMPLES 1 TO 4

In comparative examples 1 to 4, the wafer having the diameter of 8-inch and the thickness of 725 µm was used, and the compositions that had been prepared in the comparative preparation examples 1 to 4 were individually used as the resin compositions for semiconductor element encapsulation. Further, in comparative examples 1 to 4, compression molding and post curing were performed under the same conditions as those of the working examples 1 to 12.

Table 1 shows the measurement results of the following evaluation items with regard to working examples 1 to 12; and comparative examples 1 to 4.

WORKING EXAMPLES 13 TO 18

In working examples 13 to 17, there was used the wafer having the diameter of 8-inch and the thickness of 725 µm; and in working example 18, there was used the 290×290 mm BT (bismaleimide triazine) resin-made organic substrate having the thickness of 700 µm. In working examples 13 to 18, the composition that had been prepared in the preparation example 2 was used as the resin composition for semiconductor element encapsulation, and the wafer molding device (MZ824-1 by APIC YAMADA CORPORATION) was used to perform compression molding under the molding conditions shown in Table 2. There, the target resin thickness was set to 100 µm when performing compression molding. Next, each resin composition for semiconductor element encapsulation was cured under the post curing conditions shown in Table 2, thus obtaining the molded products of working examples 13 to 18.

COMPARATIVE EXAMPLES 5 TO 9

In comparative examples 5; and 7 to 9, there was used the wafer having the diameter of 8-inch and the thickness of 725 µm; and in comparative example 6, there was used the 290×290 mm BT (bismaleimide triazine) resin-made organic substrate having the thickness of 700 µm. In comparative examples 5 to 9, the composition that had been prepared in the preparation example 2 was used as the resin composition for semiconductor element encapsulation, and the wafer molding device (MZ824-1 by APIC YAMADA CORPORATION) was used to perform compression molding under the molding conditions shown in Table 2. There, the target resin thickness was set to 100 µm when performing compression molding. Next, each resin composition for semiconductor element encapsulation was cured under the post curing conditions shown in Table 2, thus obtaining the molded products of comparative examples 5 to 9.

Table 2 shows the measurement results of the following evaluation items with regard to working examples 13 to 18; and comparative examples 5 to 9.

Evaluation Items
(1) Viscosity
  An E-type viscometer was used to measure the viscosity value of the resin composition of the invention two minutes after positioning the specimen thereof. The viscosity measurement was carried out under the measurement temperature of 25° C. and in accordance with JIS Z8803:2011.
(2) Flow Mark, Filling Failure, Warpage Measurement
  The outer appearances of the molded products prepared were visually examined so as to inspect warpage as well as the presence or absence of flow marks and filling failures.
(3) Warpage Measurement
  Warpage of each molded product was measured as follows. That is, the molded product was at first placed in a horizontal location under room temperature (25° C.), followed by measuring the displacements thereof in the vertical direction, and then taking the largest numerical value of displacement.

TABLE 1

| | Preparation example | | | | | | | | | | | | Comparative preparation example | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 1 | 2 | 3 | 4 |
| Liquid epoxy resin (A1) | 49.1 | 44.9 | | | 44.9 | 44.9 | 44.9 | 44.9 | 44.9 | 44.9 | 44.9 | | 44.9 | 44.9 | 44.9 | 95 |
| Liquid epoxy resin (A2) | | | 34.3 | | | | | | | | | 34.3 | | | | |
| Liquid epoxy resin (A3) | | | | 40.8 | | | | | | | | | | | | |
| Curing agent (B1) | 45.9 | | | | | | | | | | | | | | | |
| Curing agent (B2) | | 50.1 | 60.7 | 54.2 | 50.1 | 50.1 | 50.1 | 50.1 | 50.1 | 50.1 | 50.1 | 60.7 | 50.1 | 50.1 | 50.1 | |
| Pre-gelatinizing agent (C1) | 10 | 10 | 10 | 10 | | 10 | 10 | 10 | 20 | 30 | 10 | 10 | | 10 | 10 | 10 |
| Pre-gelatinizing agent (C2) | | | | | 10 | | | | | | | | | | | |
| Filler (D1) | 259 | 444 | 444 | 444 | 444 | | | | | | 444 | 444 | 444 | | 2,800 | 444 |
| Filler (D2) | | | | | | 444 | 100 | 1,278 | 484 | 524 | | | | | | |
| Curing accelerator (E1) | 5 | 5 | 5 | 5 | 5 | 5 | 5 | 5 | 5 | 5 | 5 | 5 | 5 | 5 | 5 | 5 |
| Pigment (E2) | 1 | 1 | 1 | 1 | 1 | 1 | 1 | 1 | 1 | 1 | 1 | 1 | 1 | 1 | 1 | 1 |

| | Working example | | | | | | | | | | | | Comparative example | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 1 | 2 | 3 | 4 |
| Encapsulation base material | Wafer | Wafer | Wafer | Wafer | Wafer | Wafer | Wafer | Wafer | Wafer | Wafer | BTsubstrate | BTsubstrate | Wafer | Wafer | Wafer | Wafer |
| Molding method | | | | | | | | | Compression | | | | | | | |
| Molding temperature [° C.] | | | | | | | | | 120 | | | | | | | |
| Molding period [sec.] | | | | | | | | | 600 | | | | | | | |
| Molding pressure [kN] | | | | | | | | | 350 | | | | | | | |
| Curing temperature [° C.] | | | | | | | | | 150 | | | | | | | |
| Curing period [hr] | | | | | | | | | 4 | | | | | | | |
| Viscosity [Pa · s] | 450 | 150 | 120 | 55 | 150 | 30 | 1 | 800 | 120 | 240 | 150 | 120 | 130 | 0.4 | Unmeasurable | 320 |
| Flow mark [Yes/No] | No | No | No | No | No | No | No | No | No | No | No | No | Yes | Unmoldable | Unmoldable | Unmoldable |
| Filling failure [Yes/No] | No | No | No | No | No | No | No | No | No | No | No | No | No | | | |
| Warpage [mm] | <1 | <1 | <1 | <1 | <1 | <1 | <1 | <1 | <1 | <1 | <1 | <1 | 3 | | | |

TABLE 2

| | Preparation example 2 |
|---|---|
| Liquid epoxy resin (A1) | 44.9 |
| Liquid epoxy resin (A2) | — |
| Liquid epoxy resin (A3) | — |
| Curing agent (B1) | — |
| Curing agent (B2) | 50.1 |
| Pre-gelatinizing agent (C1) | 10 |
| Pre-gelatinizing agent (C2) | — |
| Filler (D1) | 444 |
| Filler (D2) | — |
| Curing accelerator (E1) | 5 |
| Pigment (E2) | 1 |

| | Working example | | | | | | Comparative example | | | | |
|---|---|---|---|---|---|---|---|---|---|---|---|
| | 13 | 14 | 15 | 16 | 17 | 18 | 5 | 6 | 7 | 8 | 9 |
| Encapsulation base material | Wafer | Wafer | Wafer | Wafer | Wafer | BTsubstrate | Wafer | BTsubstrate | Wafer | Wafer | Wafer |
| Molding method | Compression | Compression | Compression | Compression | Compression | Compression | Transfer | Transfer | Compression | Compression | Compression |
| Molding temperature [° C.] | 100 | 120 | 120 | 120 | 150 | 150 | 150 | 150 | 80 | 180 | 180 |
| Molding period [sec.] | 1,200 | 600 | 600 | 600 | 400 | 400 | 400 | 400 | 1,200 | 400 | 10 |

TABLE 2-continued

| Molding pressure [kN] | 50 | 50 | 250 | 250 | 250 | 250 | 20 | 20 | 250 | 250 | 250 |
|---|---|---|---|---|---|---|---|---|---|---|---|
| Curing temperature [° C.] | 150 | 150 | 150 | 180 | 150 | 180 | 150 | 150 | 150 | 150 | 150 |
| Curing period [hr] | 4 | 4 | 4 | 2 | 4 | 2 | 4 | 4 | 4 | 4 | 4 |
| Viscosity [Pa · s] | | | | | 150 | | | | | | |
| Flow mark [Yes/No] | No | No | No | No | No | No | Yes | Yes | Uncured | Yes | Yes |
| Filling failure [Yes/No] | No | No | No | No | No | No | Yes | Yes | | Yes | Yes |
| Warpage [mm] | <1 | <1 | <1 | <1 | <1 | <1 | 3 | 2 | | 4 | 4 |

What is claimed is:

1. A method for encapsulating a semiconductor element-mounted base material, comprising an encapsulation step of collectively encapsulating
 a semiconductor element-mounted surface of a semiconductor element-mounted substrate of a size of not smaller than 200 mm square; or
 a semiconductor element-formed surface of a semiconductor element-formed wafer having a diameter of not smaller than 200 mm φ, using a curable epoxy resin composition comprising
 (A) an epoxy resin;
 (B) a curing agent;
 (C) a pre-gelatinizing agent in an amount of 5 to 30 parts by mass per a total of 100 parts by mass of said epoxy resin (A) and said curing agent (B); and
 (D) a filler in an amount of 100 to 2,500 parts by mass per a total of 100 parts by mass of said epoxy resin (A), said curing agent (B) and said pre-gelatinizing agent (C), wherein said encapsulation step is performed under the following conditions:
 (a) molding method: compression molding;
 (b) molding temperature: 100 to 175° C.;
 (c) molding period: 2 to 20 min; and
 (d) molding pressure: 50 to 350 kN.

2. The method for encapsulating the semiconductor element-mounted base material according to claim 1, wherein post curing is further performed in said encapsulation step under the following conditions:
 (e) curing temperature: 100 to 250° C.; and
 (f) curing period: 0.5 to 10 hours.

3. The method for encapsulating the semiconductor element-mounted base material according to claim 1, wherein said curing agent (B) is an acid anhydride-based curing agent, and is used in an amount at which a molar ratio of acid anhydride groups in said acid anhydride-based curing agent to 1 mol of epoxy groups in said epoxy resin (A) becomes 0.5 to 1.5.

4. The method for encapsulating the semiconductor element-mounted base material according to claim 1, wherein said curing agent (B) is an phenol-based curing agent, and is used in an amount at which a molar ratio of phenolic hydroxyl groups in said phenol-based curing agent to 1 mol of epoxy groups in said epoxy resin (A) becomes 0.5 to 2.0.

5. The method for encapsulating the semiconductor element-mounted base material according to claim 1, wherein said pre-gelatinizing agent (C) is a thermoplastic resin.

6. The method for encapsulating the semiconductor element-mounted base material according to claim 2, wherein said curing agent (B) is an acid anhydride-based curing agent, and is used in an amount at which a molar ratio of acid anhydride groups in said acid anhydride-based curing agent to 1 mol of epoxy groups in said epoxy resin (A) becomes 0.5 to 1.5.

7. The method for encapsulating the semiconductor element-mounted base material according to claim 2, wherein said curing agent (B) is an phenol-based curing agent, and is used in an amount at which a molar ratio of phenolic hydroxyl groups in said phenol-based curing agent to 1 mol of epoxy groups in said epoxy resin (A) becomes 0.5 to 2.0.

8. The method for encapsulating the semiconductor element-mounted base material according to claim 2, wherein said pre-gelatinizing agent (C) is a thermoplastic resin.

9. The method for encapsulating the semiconductor element-mounted base material according to claim 3, wherein said pre-gelatinizing agent (C) isa thermoplastic resin.

10. The method for encapsulating the semiconductor element-mounted base material according to claim 4, wherein said pre-gelatinizing agent (C) is a thermoplastic resin.

11. The method for encapsulating the semiconductor element-mounted base material according to claim 6, wherein said pre-gelatinizing agent (C) is a thermoplastic resin.

12. The method for encapsulating the semiconductor element-mounted base material according to claim 7, wherein said pre-gelatinizing agent (C) is a thermoplastic resin.

* * * * *